United States Patent
Fujii et al.

(10) Patent No.: US 11,993,851 B2
(45) Date of Patent: May 28, 2024

(54) AQUEOUS SOLUTION FOR SURFACE TREATMENT, METHOD FOR PRODUCING SURFACE-TREATED ALLOY, AND COMPOSITE AND METHOD FOR PRODUCING THE SAME

(71) Applicant: MITSUBISHI GAS CHEMICAL COMPANY, INC., Chiyoda-ku (JP)

(72) Inventors: Tomoko Fujii, Katsushika-ku (JP); Kazuhiko Ikeda, Ashigarakami-gun (JP); Shun Fukazawa, Ashigarakami-gun (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 156 days.

(21) Appl. No.: 16/965,683

(22) PCT Filed: Jan. 23, 2019

(86) PCT No.: PCT/JP2019/002086
§ 371 (c)(1),
(2) Date: Jul. 29, 2020

(87) PCT Pub. No.: WO2019/151080
PCT Pub. Date: Aug. 8, 2019

(65) Prior Publication Data
US 2021/0381111 A1    Dec. 9, 2021

(30) Foreign Application Priority Data
Feb. 1, 2018  (JP) .................................. 2018-016357

(51) Int. Cl.
*C23C 18/38* (2006.01)
*B29C 45/14* (2006.01)
(Continued)

(52) U.S. Cl.
CPC ........ *C23C 18/38* (2013.01); *B29C 45/14311* (2013.01); *B32B 15/08* (2013.01);
(Continued)

(58) Field of Classification Search
None
See application file for complete search history.

(56) References Cited

U.S. PATENT DOCUMENTS

2008/0041824 A1* 2/2008 Feng .................... C23F 1/18
  252/79.4
2010/0252530 A1* 10/2010 Durante .................... C23F 1/44
  252/79.1
(Continued)

FOREIGN PATENT DOCUMENTS

CN  101778923 A   7/2010
CN  104233302 A   12/2014
(Continued)

OTHER PUBLICATIONS

PubChem—Cupric chloride_CuCl2—Mar. 23, 2022 (Year: 2022).*
International Search Report dated Apr. 16, 2019 in PCT/JP2019/002086 filed Jan. 23, 2019, 2 pages.

*Primary Examiner* — Jiong-Ping Lu
(74) *Attorney, Agent, or Firm* — Oblon, McClelland, Maier & Neustadt, L.L.P.

(57) ABSTRACT

An aqueous solution for surface treatment, for treating a surface of an alloy, the aqueous solution comprising: a copper compound at a copper ion concentration of 20000 ppm or more and 50000 ppm or less; a heterocyclic nitrogen compound at a concentration of 200 ppm or more and 3000 ppm or less; and a halide ion at a concentration of 2000 ppm or more and 70000 ppm or less.

21 Claims, 9 Drawing Sheets

(51) Int. Cl.

| | | |
|---|---|---|
| *B32B 15/08* | (2006.01) | |
| *B32B 15/088* | (2006.01) | |
| *B32B 15/09* | (2006.01) | |
| *B32B 15/20* | (2006.01) | |
| *B32B 27/20* | (2006.01) | |
| *B32B 27/28* | (2006.01) | |
| *B32B 27/34* | (2006.01) | |
| *B32B 27/36* | (2006.01) | |
| *C09D 167/02* | (2006.01) | |
| *C09D 177/00* | (2006.01) | |
| *C09D 181/02* | (2006.01) | |
| *C23F 1/02* | (2006.01) | |
| *C23F 1/14* | (2006.01) | |
| *B29K 705/02* | (2006.01) | |

(52) U.S. Cl.
CPC ............ *B32B 15/088* (2013.01); *B32B 15/09* (2013.01); *B32B 15/20* (2013.01); *B32B 27/20* (2013.01); *B32B 27/286* (2013.01); *B32B 27/34* (2013.01); *B32B 27/36* (2013.01); *C09D 167/02* (2013.01); *C09D 177/00* (2013.01); *C09D 181/02* (2013.01); *C23F 1/02* (2013.01); *C23F 1/14* (2013.01); *B29K 2705/02* (2013.01); *B32B 2250/02* (2013.01); *B32B 2262/101* (2013.01); *B32B 2307/538* (2013.01); *B32B 2307/54* (2013.01); *B32B 2605/08* (2013.01); *B32B 2605/18* (2013.01)

(56) References Cited

U.S. PATENT DOCUMENTS

| | | | | |
|---|---|---|---|---|
| 2014/0178572 | A1* | 6/2014 | Chow | ................... H05K 3/187 427/97.9 |
| 2015/0267305 | A1* | 9/2015 | Choi | ................. H01L 21/30604 216/13 |
| 2015/0283793 | A1 | 10/2015 | Koizumi et al. | |
| 2019/0299503 | A1 | 10/2019 | Kimura et al. | |

FOREIGN PATENT DOCUMENTS

| | | | | |
|---|---|---|---|---|
| CN | 106367755 | * | 2/2017 | ................ C23F 1/18 |
| EP | 1 500 719 | A1 | 1/2005 | |
| EP | 2 894 240 | A1 | 7/2015 | |
| JP | 2010-537042 | A | 12/2010 | |
| JP | 2013-95975 | A | 5/2013 | |
| JP | 2013-135039 | A | 7/2013 | |
| WO | WO 2009/023073 | A1 | 2/2009 | |
| WO | WO 2009/078466 | A1 | 6/2009 | |
| WO | WO 2009/093668 | A1 | 7/2009 | |
| WO | WO 2014/061521 | A1 | 4/2014 | |
| WO | WO2017000890 | * | 1/2017 | ................ C25D 3/38 |
| WO | WO 2017/209011 | A1 | 12/2017 | |

\* cited by examiner

AQUEOUS SOLUTION FOR SURFACE TREATMENT, METHOD FOR PRODUCING SURFACE-TREATED ALLOY, AND COMPOSITE AND METHOD FOR PRODUCING THE SAME

TECHNICAL FIELD

The present invention relates to an aqueous solution for surface treatment, a method for producing a surface-treated alloy, and a composite and a method for producing the composite.

BACKGROUND ART

Various techniques for bonding metal alloys and resins have been conventionally known. Examples of one of such techniques include a method involving bonding a metal alloy and a resin with an adhesive interposed therebetween, and many adhesives therefor have been developed. Such an adhesive known is, for example, an adhesive that enables a metal alloy and a resin to be bonded at ordinary temperature or by heating.

Meanwhile, techniques for bonding metal alloys and resins without any adhesives are also studied. For example, a method is known where an alloy of a light metal such as magnesium or aluminum, or an iron alloy such as stainless steel is integrated with a high-strength, thermoplastic engineering resin by injection or the like without any adhesive interposed therebetween.

There has also been proposed, as such a technique for bonding a metal alloy and a resin with or without an adhesive interposed therebetween, a technique for allowing a surface of a metal alloy to be porous for the purpose of an enhancement in bonding properties between an alloy and a resin. For example, Patent Literature 1 is aimed at providing a bonded product or the like where a metal alloy and an adherend are strongly bonded with an unsaturated polyester-based adhesive interposed therebetween, and discloses a bonded product of a metal alloy and an adherend, which is a bonded product where a metal alloy and an adherend are bonded with an adhesive interposed therebetween, wherein the surface of the metal alloy is subjected to etching and thus has degrees of roughness in the order of microns, corresponding to an average top and bottom interval (RSm) of 0.8 to 10 μm and a maximum height roughness (Rz) of 0.2 to 5 μm, allows ultrafine concave and convex portions to be formed at a period of 5 to 500 nm in the surface having such degrees of roughness, and is provided with a surface layer which is a thin layer of metal oxide or metal phosphate; the adhesive includes an unsaturated polyester resin or a vinyl ester resin as main components; and the adhesive penetrates into the ultrafine concave and convex portions to thereby strongly bond the metal alloy and the adherend.

CITATION LIST

Patent Literature

Patent Literature 1: International Publication No. WO 2009/093668

SUMMARY OF INVENTION

Technical Problem

In a case, however, where a resin composition is used as an adherend and furthermore a metal alloy and the resin composition as an adherend are bonded without any adhesive, it cannot be said that a conventional technique has imparted sufficient bonding strength between the metal alloy and the resin composition, and there is room for further improvement. A solution for such improvement is considered to be a method involving contacting a treatment liquid with the surface of a metal alloy to such an extent that bonding strength between the metal alloy and a resin composition is increased, thereby roughening the surface. Patent Literature 1, while describes a technique for roughening the surface of a metal alloy (allowing the surface to be porous), has room for further improvement in direct bonding between a metal alloy and a resin composition.

The present invention has been made in view of the above circumstances, and an object thereof is to provide an aqueous solution for surface treatment of an alloy, which enables bonding strength between the alloy and a resin composition to be increased, a method for producing a surface-treated alloy by use of the aqueous solution for surface treatment, and a composite including the surface-treated alloy and a method for producing the composite.

Solution to Problem

The present inventors have made intensive studies in order to achieve the above object, and as a result, have found that an aqueous solution for surface treatment, for treating the surface of an alloy, having a specified composition can provide an increased bonding strength between an alloy and a resin composition to be increased, thereby leading to completion of the present invention.

That is, the present invention is as follows.

[1] An aqueous solution for surface treatment, for treating a surface of an alloy, the aqueous solution comprising: a copper compound at a copper ion concentration of 20000 ppm or more and 50000 ppm or less; a heterocyclic nitrogen compound at a concentration of 200 ppm or more and 3000 ppm or less; and a halide ion at a concentration of 2000 ppm or more and 70000 ppm or less.

[2] The aqueous solution for surface treatment, wherein the heterocyclic nitrogen compound is an azole compound.

[3] The aqueous solution for surface treatment, wherein the azole compound is one or more selected from the group consisting of pyrazole, 5-aminotetrazole and imidazole.

[4] The aqueous solution for surface treatment, wherein the copper compound is one or more selected from the group consisting of copper (II) sulfate and copper (II) bromide.

[5] The aqueous solution for surface treatment, wherein the halide ion is one or more selected from the group consisting of a bromide ion and a chloride ion.

[6] The aqueous solution for surface treatment, wherein the alloy is an aluminum alloy.

[7] A method for producing a surface-treated alloy, comprising: a step of contacting the aqueous solution for surface treatment with a surface of an alloy; and a step of dissolving or dispersing copper deposited on the surface of an alloy in the contacting step, in an aqueous solution comprising an oxidant and an acid, to remove the copper, thereby obtaining a surface-treated alloy.

[8] The production method, wherein the oxidant is peroxide.

[9] The production method, wherein the acid is an inorganic acid.

[10] A composite comprising: a surface-treated alloy obtained by the production method; and a resin composition comprising a thermoplastic resin, wherein the resin composition is bonded to the surface-treated alloy.

[11] A method for producing a composite, comprising: a step of bonding a surface-treated alloy obtained by the production method and a resin composition comprising a thermoplastic resin, thereby obtaining a composite.

[12] The method for producing a composite, further comprising a step of inserting the surface-treated alloy into a mold, before the step of obtaining a composite, wherein, in the step of obtaining a composite, the resin composition comprising a thermoplastic resin is injected into and molded in the mold to thereby bond the surface-treated alloy and the resin composition.

Advantageous Effect of Invention

The present invention can provide an aqueous solution for surface treatment of an alloy, which enables bonding strength between the alloy and a resin composition to be increased, a method for producing a surface-treated alloy by use of the aqueous solution for surface treatment, and a composite including the surface-treated alloy and a method for producing the composite.

DESCRIPTION OF EMBODIMENTS

Figure 1:
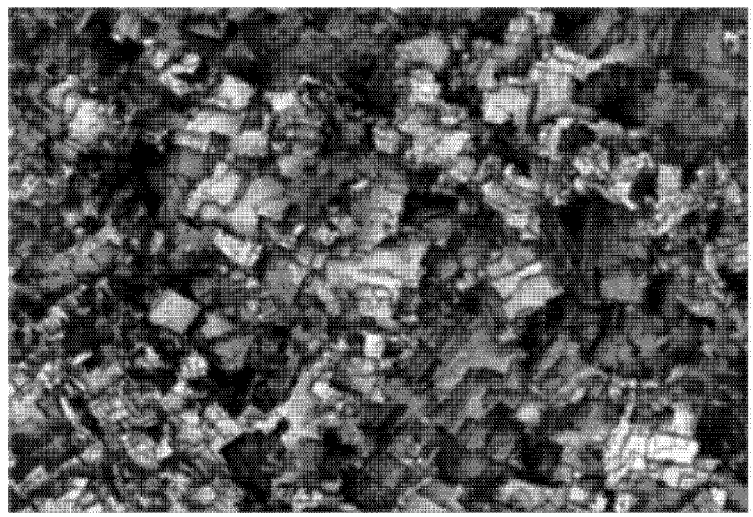
FIG. 1 is a laser microscope image illustrating the surface of a composite of Example 1.

Hereinafter, an embodiment for carrying out the present invention (hereinafter, simply referred to as "present embodiment".) will be described in detail, if necessary, with reference to the drawing, but the present invention is not intended to be limited to the following present embodiment. The present invention can be variously modified without departing from the gist thereof.

An aqueous solution for surface treatment of the present embodiment is an aqueous solution for surface treatment, for treating the surface of an alloy, the aqueous solution containing a copper compound at a copper ion concentration of 20000 ppm or more and 50000 ppm or less, a heterocyclic nitrogen compound at a concentration of 200 ppm or more and 3000 ppm or less, and a halide ion at a concentration of 2000 ppm or more and 50000 ppm or less. An alloy treated by use of the aqueous solution for surface treatment (Hereinafter, referred to as "surface-treated alloy".) is provided with a surface which is roughened so as to have any roughness in the order of microns. Thus, when the surface-treated alloy is bonded to a resin composition, the resin composition penetrates into a concave portion on the surface of the surface-treated alloy. As a result, the resin composition can be engaged with the surface-treated alloy by the anchoring effect, resulting in an increase in bonding strength between the surface-treated alloy and the resin composition. The reason why the use of the aqueous solution for surface treatment (Hereinafter, also simply referred to as "aqueous solution".) can lead to roughening of the surface of an alloy so that any roughness in the order of microns is achieved is not clear; however, the reason is considered by the present inventors as follows, although not limited thereto. That is, the surface of an alloy is contacted with the aqueous solution, and thus the surface of an alloy is oxidized to form a local battery. As a result, not only any metal which has a less noble potential and is present in the vicinity of the surface of an alloy among metals included in the alloy, is eluted in the aqueous solution due to a battery reaction, but also a copper ion which is noble, in the aqueous solution, is deposited in a proper amount as metallic copper on the surface of the alloy. The aqueous solution of the present embodiment here includes a heterocyclic nitrogen compound at a predetermined concentration, and thus the heterocyclic nitrogen compound has the function of interacting with the copper ion and controlling the shape of copper deposited to thereby also control the roughened shape of the alloy dissolved in the aqueous solution. Furthermore, the copper deposited on the surface of the alloy is then dissolved or dispersed and thus removed. The aqueous solution of the present embodiment here includes a halide ion at a predetermined concentration, and thus has the function of reacting with an oxide formed on the surface of the alloy to thereby promote elution of the oxide on the alloy into the aqueous solution. Thus, the surface of the alloy (surface-treated alloy) has concave and convex portions having a depth in the order of micrometers.

Examples of the copper compound as a copper ion source included in the aqueous solution of the present embodiment include copper (II) sulfate, copper tetrafluoroborate, copper (II) bromide, copper (II) oxide, copper phosphate, copper acetate, copper formate and copper nitrate, which may be each an anhydride or pentahydrate. In particular, copper (II) sulfate and copper (II) bromide are preferable, and copper (II) sulfate is more preferable from the viewpoint that the operation and effect of the present invention are more effectively and certainly exerted. Such compounds are used singly or in combinations of two or more kinds thereof.

The concentration of the copper compound in the aqueous solution is not particularly limited as long as the concentration in terms of the copper ion concentration is 20000 ppm or more and 50000 ppm or less, preferably 20000 ppm or more and 45000 ppm or less, particularly preferably 25000 ppm or more and 45000 ppm or less. With the copper ion concentration falling within the range, the effect of eluting a main metal ion in the alloy and depositing the copper compound on the alloy can be more effectively and certainly exerted. With the copper ion concentration of 50000 ppm or less, deposition of a copper ion can be more effectively and certainly suppressed.

The aqueous solution of the present embodiment includes a heterocyclic nitrogen compound from the viewpoint that the surface of the alloy is more effectively and certainly roughened. It is considered that the heterocyclic nitrogen compound has the function of interacting with the copper ion and controlling the shape of copper deposited to thereby also control the roughened shape of the alloy dissolved in the aqueous solution. The heterocyclic nitrogen compound is not particularly limited as long as the compound is a compound bearing a heterocyclic ring having a nitrogen atom therein, and is preferably an azole compound from the viewpoint that the operation and effect of the present invention are more effectively and certainly exerted. The azole compound here refers to a 5-membered heterocyclic ring compound having one or more nitrogen atoms therein. Examples of the azole compound include pyrazole, imidazole, triazole, 5-aminotetrazole and tetrazole each optionally having a substituent. In particular, pyrazole, 5-aminotetrazole and imidazole are more preferable and pyrazole is further preferable, from the viewpoint that the operation and effect of the present invention are more effectively and certainly exerted. Such compounds are used singly or in combinations of two or more kinds thereof.

The concentration of the heterocyclic nitrogen compound in the aqueous solution is 200 ppm or more and 3000 ppm or less, more preferably 200 ppm or more and 2000 ppm or less, further preferably 300 ppm or more and 1000 ppm or less. When the concentration is 200 ppm or more, the surface of the alloy can be more effectively and certainly roughened to allow concave and convex portions suitable for bonding to a resin to be provided on the surface of the alloy. When the concentration is 3000 ppm or less, the surface of the alloy can be more effectively and certainly roughened.

The aqueous solution of the present embodiment includes a halide ion from the viewpoint that the surface of the alloy is more effectively and certainly roughened. It is considered that the halide ion has the function of reacting with the oxide formed on the surface of the alloy and thus promoting elution of the oxide on the alloy into the aqueous solution. Examples of the halide ion include a chloride ion and a bromide ion. In particular, a chloride ion is preferable from the viewpoint that the operation and effect of the present invention are more effectively and certainly exerted.

The concentration of the halide ion in the aqueous solution is 2000 ppm or more and 70000 ppm or less, more preferably 2000 ppm or more and 50000 ppm or less, further preferably 2000 ppm or more and 40000 ppm or less. When the concentration of the halide ion is 2000 ppm or more and 70000 ppm or less, the effect of more dissolving an oxide coating present on the alloy and further activating a reaction of copper with the alloy is exerted. When the concentration is 2000 ppm or more and 40000 ppm or less, the surface of the alloy can be more effectively and certainly roughened.

Examples of the halide providing the halide ion include alkali metal halides such as sodium halide and potassium halide, alkali earth metal halides such as calcium halide, and ammonium halide and copper halide. In particular, an alkali metal halide is preferable, an alkali metal chloride is more preferable, and sodium chloride is more preferable, from the viewpoint that the operation and effect of the present invention are more effectively and certainly exerted. Such halides are used singly or in combinations of two or more kinds thereof. The halide may be overlapped with the copper compound. For example, when copper halide is used as the halide, such copper halide also corresponds to the copper compound.

The aqueous solution of the present embodiment may include any of various additives commonly used in surface treatment of alloys as long as the effect of the present invention is not impaired. Such additives are used singly or in combinations of two or more kinds thereof.

The aqueous solution of the present embodiment can be contacted with the surface of an alloy, thereby allowing for production of a surface-treated alloy roughened so that the surface of the alloy has any roughness in the order of microns. Thus, when the surface-treated alloy is bonded to a resin composition, the resin composition penetrates into a concave portion on the surface of the surface-treated alloy. As a result, the resin composition can be engaged with the surface-treated alloy by the anchoring effect, resulting in an increase in bonding strength between the surface-treated alloy and the resin composition. The aqueous solution of the present embodiment can allow each surface of a range of alloys different in composition to be roughened so that the surface has a desired roughness. Accordingly, when a plurality of alloys different in composition are treated, there is no need for the changes in the type and the composition of a liquid with respect to each of the alloys, and the labor hour for production of the surface-treated alloy can be reduced to result in a decrease in time.

A method for producing a surface-treated alloy of the present embodiment includes a step of contacting the aqueous solution with the surface of an alloy (contacting step), and a step of dissolving or dispersing copper deposited on the surface of an alloy in the contacting step, in an aqueous solution including an oxidant and an acid (hereinafter, also referred to as "aqueous oxidant-acid solution".), to remove the copper, thereby obtaining a surface-treated alloy (copper removal step).

In the contacting step, the aqueous solution is contacted with the surface of an alloy. The alloy, namely, an alloy before treatment with the aqueous solution for surface treatment of the present embodiment is not particularly limited, and examples thereof include an aluminum alloy, a magnesium alloy, a molten zinc alloy, and iron and steel.

In particular, an aluminum alloy is preferable from the viewpoint that the operation and effect of the present invention are more effectively and certainly exerted. The aluminum alloy is not particularly limited, and examples thereof include a pure aluminum-based aluminum alloy having an aluminum content of 99% by mass or more, an aluminum-copper-based aluminum alloy mainly containing copper in addition to aluminum, an aluminum-manganese-based aluminum alloy mainly containing manganese in addition to aluminum, and an aluminum-magnesium alloy mainly containing magnesium in addition to aluminum. More specific examples include all alloys of A1000s to 7000s (corrosion-resistant aluminum alloy, high-tensile aluminum alloy, heat-resistant aluminum alloy, and the like), such as wrought aluminum alloys including pure aluminum-based A1100 alloy, A1085 alloy and A1050 alloy, an aluminum-copper-based A2024 alloy, an aluminum-manganese-based A3003 alloy and an aluminum-magnesium-based A5052 alloy, and casting aluminum alloys such as ADC 1 to 12 models (die-casting aluminum alloys), prescribed in Japanese Industrial Standards (JIS).

The composition of the aluminum alloy is, for example, as follows with respect to the content of each element: the content of silicon (Si) is 1.5% by mass or less, the content of iron (Fe) is 1.0% by mass or less, the content of copper (Cu) is 8.0% by mass or less, the content of manganese (Mn) is 2.0% by mass or less, the content of magnesium (Mg) is 6.0% by mass or less, the content of chromium (Cr) is 0.50% by mass or less, the content of zinc (Zn) is 8.0% by mass or less, the content of titanium (Ti) is 0.30% by mass or less, the content of vanadium (V) is 0.25% by mass or less, the content of bismuth (Bi) is 1.0% by mass or less and the content of lead (Pb) is 1.0% by mass or less, and the balance includes aluminum (Al) and inevitable impurities. The composition of the aluminum alloy is exemplified in Table 1, but the composition is not limited thereto.

TABLE 1

| Alloy No. | | A1050 | A1080 | A1100 | A2024 |
|---|---|---|---|---|---|
| Composition (% by mass) | Si | 0.25 or less | 0.15 or less | 0.95 or less in total | 0.50 or less |
| | Fe | 0.40 or less | 0.15 or less | | 0.50 or less |
| | Cu | 0.05 or less | 0.03 or less | 0.05-0.20 | 3.8-4.9 |
| | Mn | 0.05 or less | 0.02 or less | 0.05 or less | 0.30-0.9 |
| | Mg | 0.05 or less | 0.02 or less | — | 1.2-1.8 |
| | Cr | — | 0.03 or less | 0.10 or less | 0.10 or less |
| | Zn | 0.05 or less | — | — | 0.25 or less |
| | Ti | 0.03 or less | 0.03 or less | — | 0.15 or less |
| | V | 0.05 or less | — | — | — |
| | Bi | — | — | — | 0.20-0.6 |
| | Pb | — | — | — | 0.20-0.6 |
| | Al | 99.50 or more | 99.50 or more | 99.00 or more | Balance |

| Alloy No. | | A3003 | A5052 | A6063 | A7075 |
|---|---|---|---|---|---|
| Composition (% by mass) | Si | — | — | 0.20-0.6 | 0.40 or less |
| | Fe | — | — | 0.35 or less | 0.50 or less |
| | Cu | — | — | 0.10 or less | 1.2-2.0 |
| | Mn | 1.0-1.5 | — | 0.10 or less | 0.30 or less |
| | Mg | — | 2.5 or less | 0.45-0.9 | 2.1-2.9 |
| | Cr | — | 0.25 or less | 0.10 or less | 0.18-0.28 |
| | Zn | — | — | 0.10 or less | 5.1-6.1 |
| | Ti | — | — | 0.10 or less | 0.20 or less |
| | V | — | — | — | — |
| | Bi | — | — | — | — |
| | Pb | — | — | — | — |
| | Al | Balance | Balance | Balance | Balance |

The alloy serving as a raw material may be a casting alloy, or may be a component formed into a predetermined shape according to a die casting method or a component formed into a predetermined shape by machining. The wrought alloy may be a component formed into a predetermined shape by machining such as hot press working, for example, a plate material serving as an intermediate material. The shape of the surface-treated alloy is also not particularly limited, and may be, for example, any of a plate shape, a columnar shape and any shape suitable for the intended use.

The magnesium alloy is not particularly limited, and examples thereof include a pure magnesium-based magnesium alloy having a magnesium content of 99% by mass or more, a magnesium-manganese-based magnesium alloy mainly containing aluminum and manganese in addition to magnesium, and a magnesium-zinc alloy mainly containing aluminum and zinc in addition to magnesium. More specific examples include all magnesium alloys such as magnesium-aluminum-zinc-based AZ31B alloy and AZ91D alloy, a magnesium-aluminum-manganese-based AM60B alloy, and a magnesium-aluminum-silicon-based AS41A alloy, prescribed in Japanese Industrial Standards (JIS).

The composition of the magnesium alloy is, for example, as follows with respect to the content of each element: the content of aluminum (Al) is 12.0% by mass or less, the content of zinc (Zn) is 8.0% by mass or less, the content of manganese (Mn) is 2.0% by mass or less, the content of silicon (Si) is 3.0% by mass or less, the content of copper (Cu) is 0.50% by mass or less, the content of nickel (Ni) is 0.05% by mass or less and the content of iron (Fe) is 0.01% by mass or less, and the balance includes magnesium (Mg) and inevitable impurities. The composition of the magnesium alloy is exemplified in Table 2, but the composition is not limited thereto.

TABLE 2

| Alloy No. | | AZ31B | AZ91D | AM0B | AS41A |
|---|---|---|---|---|---|
| Composition (% by mass) | Al | 2.5-3.5 | 8.3-9.7 | 5.3-6.5 | 3.5-5.0 |
| | Zn | 0.50-1.5 | 0.35-1.0 | 0.22 or less | 0.12 or less |
| | Mn | 0.2 or less | 0.15 or less | 0.25 or less | 0.2-0.5 |
| | Si | 0.10 or less | 0.10 or less | 0.10 or less | 0.5-1.5 |
| | Cu | 0.10 or less | 0.03 or less | 0.010 or less | 0.06 or less |
| | Ni | 0.005 or less | 0.002 or less | 0.002 or less | 0.03 or less |
| | Fe | 0.003 or less | 0.005 or less | 0.005 or less | — |
| | Zr | — | — | — | — |
| | Mg | Balance | Balance | Balance | Balance |

| Alloy No. | | EZ33A | WE54A | ZK60A |
|---|---|---|---|---|
| Composition (% by mass) | Al | — | — | — |
| | Zn | 2.0-3.1 | 0.20 or less | 4.8-6.2 |
| | Mn | 0.5-1.0 | 0.15 or less | — |
| | Si | — | 0.01 or less | — |
| | Cu | 0.10 or less | 0.03 or less | 0.03 or less |
| | Ni | 0.01 or less | 0.005 or less | 0.005 or less |
| | Fe | — | — | — |
| | Zr | — | — | 0.4-0.8 |
| | Mg | Balance | Balance | Balance |

The temperature (liquid temperature) and the time in contacting of the aqueous solution with the alloy in the contacting step are not particularly limited as long as the temperature and the time are any temperature and any time that enable the object of the present invention to be achieved, and are preferably 20° C. or more and 70° C. or less and preferably 30 seconds or more and 10 minutes or less, respectively. When the temperature and the time are each within the lower limit or more and the upper limit or less, the surface of the alloy can be more effectively and certainly roughened as desired.

The procedure for contacting the aqueous solution with the alloy in the contacting step is not particularly limited, and examples thereof include a method including jetting or spraying the aqueous solution toward the surface of the alloy (jet coating or spray coating), a method including coating the surface of the alloy with the aqueous solution by use of a brush or a blade, a method including rotating the alloy with dropping of the aqueous solution onto the surface of the alloy and spreading the aqueous solution over the surface of the alloy by use of its centrifugal force (spin coating), and a method including dipping the alloy in a bath of the aqueous solution (dip coating). In particular, dip coating is preferable from the viewpoint that the operation and effect of the present invention are more effectively and certainly exerted.

The aqueous solution according to the present embodiment may include any of various additives commonly used in surface treatment of an aluminum alloy as long as the effect of the present invention is not impaired. Examples of such additives include a surfactant and a pH adjuster. Such additives are used singly or in combinations of two or more kinds thereof.

In the copper removal step, copper deposited on the surface of the alloy in the contacting step is dissolved or dispersed in the aqueous oxidant-acid solution, and removed, thereby obtaining a surface-treated alloy. The oxidant has the function of oxidizing the copper deposited on the surface of the alloy and facilitating dissolution or dispersion from the surface of the alloy. Examples of the oxidant include peroxides such as hydrogen peroxide, peracetic acid and persulfate. In particular, hydrogen peroxide is preferable from the viewpoint that the operation and effect of the present invention are more effectively and certainly exerted. Such oxidants are used singly or in combinations of two or more kinds thereof.

The content of the oxidant in the aqueous oxidant-acid solution is preferably 0.5% by mass or more and 20% by mass or less, more preferably 1.0% by mass or more and 10% by mass or less based on 100% by mass of the aqueous oxidant-acid solution. When the concentration is 0.5% by mass or more, the treatment of removal of copper with the aqueous oxidant-acid solution can be more rapidly performed, and when the concentration is 20% by mass or less, such a case is preferable from the viewpoint that the operation and effect of the present invention can be more effectively and certainly exerted.

The acid in the aqueous oxidant-acid solution has the function of dissolving or dispersing the copper deposited on the surface of the alloy. The acid may be an inorganic acid or an organic acid. Herein, an inorganic acid is preferable from the viewpoint that the operation and effect of the present invention are more effectively and certainly exerted. Examples of the inorganic acid include sulfuric acid, nitric acid, hydrochloric acid and phosphoric acid. Examples of the organic acid include acetic acid, citric acid, lactic acid and malic acid. Herein, the inorganic acid and the organic acid are not limited to the above. In particular, sulfuric acid is preferable from the viewpoint that the operation and effect of the present invention are more effectively and certainly exerted. Such acids are used singly or in combinations of two or more kinds thereof.

The content of the acid in the aqueous oxidant-acid solution is preferably 0.5% by mass or more and 20% by mass or less, more preferably 1.0% by mass or more and 10% by mass or less based on 100% by mass of the aqueous solution. When the concentration is 0.5% by mass or more, the treatment of removal of copper with the aqueous oxidant-acid solution can be more rapidly performed, and when the concentration is 20% by mass or less, such a case is preferable from the viewpoint that the operation and effect of the present invention can be more effectively and certainly exerted.

The temperature (liquid temperature) and the time in contacting of the aqueous oxidant-acid solution with the alloy after surface treatment, in the copper removal step, are not particularly limited as long as the temperature and the time are any temperature and any time that enable the object of the present invention to be achieved, and are preferably 20° C. or more and 70° C. or less and preferably 30 seconds or more and 10 minutes or less, respectively. When the temperature and the time are each within the lower limit or more and the upper limit or less, the copper deposited on the surface of the alloy can be selectively removed more effectively and certainly.

The procedure for contacting the aqueous oxidant-acid solution with the alloy after surface treatment in the copper removal step is not particularly limited, and examples thereof include a method including jetting or spraying aqueous solution toward the surface of the alloy (jet coating or spray coating), a method including coating the surface of the alloy with the aqueous oxidant-acid solution by use of a brush or a blade, a method including rotating the alloy with dropping of the aqueous oxidant-acid solution onto the surface of the alloy and spreading the aqueous oxidant-acid solution over the surface of the alloy by use of its centrifugal force (spin coating), and a method including dipping the alloy in a bath of the aqueous oxidant-acid solution (dip coating). In particular, dip coating is preferable from the viewpoint that the operation and effect of the present invention are more effectively and certainly exerted.

A composite of the present embodiment includes the surface-treated alloy and a resin composition including a thermoplastic resin, in which the resin composition is bonded to the surface-treated alloy. The resin composition in the composite is a solid, and examples of the thermoplastic resin included in the resin composition include polycarbonate (PC), polybutylene terephthalate (PBT), polyethylene terephthalate (PET), polypropylene (PP), polyamide (PA) and polyphenylene sulfide (PPS). In particular, PPS or PA is preferable from the viewpoint that the operation and effect of the present invention are more effectively and certainly exerted. Such thermoplastic resins are used singly or in combinations of two or more kinds thereof.

The resin composition in the present embodiment is for use as a material of a molded product obtained by injection molding or the like, and is different from a resin composition for use as an adhesive, in this respect.

The resin composition in the present embodiment preferably include a fibrous or particulate filler from the viewpoint that the respective linear coefficients of expansion of different materials are made close to each other to result in an increase in tensile strength, and the filler is more preferably a fibrous filler, further preferably a glass fiber. Examples of the glass fiber include a long fiber, a short fiber and a cloth article. Such fillers are used singly or in combinations of two or more kinds thereof.

When the resin composition includes the thermoplastic resin and the filler, the content of the thermoplastic resin is preferably 10% by mass or more and 70% by mass or less, more preferably 15% by mass or more and 70% by mass or less based on 100% by mass of the resin composition. The content of the filler is preferably 10% by mass or more and 70% by mass or less, more preferably 15% by mass or more and 70% by mass or less based on 100% by mass of the resin composition. When the contents of the thermoplastic resin and the filler fall within the above respective ranges, the linear coefficient of expansion of the surface-treated alloy whose surface is roughened by use of the aqueous solution for surface treatment of the present embodiment is closer to that of the resin composition. As a result, the effect of enhancing bonding strength in direct bonding of different materials can be more remarkably exerted.

The shape of the composite may be any shape suitable for the intended application. Examples of the application of the composite include an automobile part and an aircraft part.

A method for producing a composite of the present embodiment includes a step of bonding the surface-treated alloy and the resin composition, thereby obtaining a composite. The bonding method is not particularly limited, and may be any method as long as such a method has been conventionally known as a method for bonding an alloy and a resin composition. The composite and the method for producing the composite of the present embodiment, particularly have the advantage of using the surface-treated alloy and thus imparting excellent bonding strength even in direct bonding between the surface-treated alloy and the resin composition without any adhesive interposed therebetween.

The method for producing the composite of the present embodiment preferably further includes a step of inserting the surface-treated alloy into a mold, before the step of obtaining the composite, in which injection molding where a resin composition including a thermoplastic resin is injected into and molded in a mold preferably allows the surface-treated alloy and the resin composition to be bonded, in the step of obtaining the composite. The production method thus allows the surface-treated alloy and the resin composition to be bonded without any adhesive interposed therebetween. Nevertheless, the surface-treated alloy of the present embodiment can be used to thereby bond the surface-treated alloy and the resin composition at high bonding strength even without any use of an adhesive. The shape of the mold may be any desired shape, and the conditions of injection molding may be appropriately set depending on the types of the surface-treated alloy used and each raw material included in the resin composition.

EXAMPLES

Hereinafter, the present invention will be described in more detail with reference to Examples, but the present invention is not intended to be limited to such Examples.

(Aqueous Solution for Surface Treatment)

Any copper compound (each manufactured by Wako Pure Chemical Industries, Ltd.)), any heterocyclic nitrogen compound (each manufactured by Wako Pure Chemical Industries, Ltd.) and any halide (each manufactured by Wako Pure Chemical Industries, Ltd.), shown in Table 3, were added to ion exchange water at any ratio shown in Table 3, and mixed to thereby prepare each aqueous solution for surface treatment.

(Aqueous Oxidant-Acid Solution)

To ion exchange water were added 0.2% by mass of hydrogen peroxide (manufactured by Kanto Kagaku, aqueous 31% solution) and 0.6% by mass of sulfuric acid (manufactured by Wako Pure Chemical Industries, Ltd.), and mixed to thereby prepare each aqueous oxidant-acid solution. Alternatively, 20% by mass of ammonium persulfate (manufactured by Mitsubishi Gas Chemical Co., Ltd.) and 0.5% by mass of nitric acid (manufactured by Wako Pure Chemical Industries, Ltd.) were added to ion exchange water, and mixed to thereby prepare each aqueous oxidant-acid solution.

(Measurement of Surface Roughness of Alloy)

The arithmetic mean curvature of peaks (Spc) in the range of 70 μm×70 μm of a plate-shaped surface-treated alloy (dimension: 50 mm×20 mm×1.5 mm) was measured with a laser microscope (product name "VK-X250" manufactured by Keyence Corporation).

(Observation of Surface of Alloy)

The surface shape of a surface-treated alloy sample was observed with a laser microscope (product name "VK-X250" manufactured by Keyence Corporation).

(Formation of Composite with Injection Molding)

An insert mold was mounted to an injection molding machine (product name "J110AD" manufactured by Japan Steel Works Ltd.), and a surface-treated alloy having a predetermined shape was placed in the mold. The mold was heated to 120° C. in advance. Next, a PPS resin composition (product name "SUSTEEL GS-40" manufactured by Tosoh Corporation) including 40% by mass of a glass fiber as a filler compounded was injection-molded into the mold in conditions of a nozzle temperature of 310° C., an injection rate of 15 mm/sec, an injection pressure of 250 MPa, a holding pressure of 130 MPa and a pressure holding time of 4 seconds, and furthermore cooled to thereby obtain a composite where the surface-treated alloy and the PPS resin composition were bonded and integrated. Alternatively, a PA resin composition (product name "RENY 1002H" manufactured by Mitsubishi Engineering-Plastics Corporation) including 30% by mass of a glass fiber as a filler compounded was injection-molded in conditions of a nozzle temperature of 280° C., an injection rate of 15 mm/sec, an injection pressure of 250 MPa, a holding pressure of 130 MPa and a pressure holding time of 4 seconds, and furthermore cooled to thereby obtain a composite where the surface-treated alloy and the PA resin composition were bonded and integrated. Alternatively, a PBT resin composition (product name "NOVADURAN 5010G30" manufactured by Mitsubishi Engineering-Plastics Corporation) including 30% by mass of a glass fiber as a filler compounded was injection-molded in conditions of a nozzle temperature of 250° C., an injection rate of 15 mm/sec, an injection pressure of 250 MPa, a holding pressure of 130 MPa and a pressure holding time of 4 seconds, and furthermore cooled to thereby obtain a composite where the surface-treated alloy and the PBT resin composition were bonded and integrated.

(Tensile Test)

The tensile strength (bonding strength) between the surface-treated alloy and the resin composition with respect to each of the composites obtained as above was measured with a tensile tester (product name "AGS-X" manufactured by Shimadzu Corporation) according to JIS K 6850.

Example 1

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A laser microscope image thereof is illustrated in FIG. 1. The Spc of the surface of the surface-treated alloy was measured according to "Measurement of surface roughness of alloy" described above, and was found to be 82418/mm. Furthermore, the tensile strength (bonding strength) between the surface-treated alloy and the PPS resin composition was measured according to "Tensile test" described above, and was found to be 31 MPa. All the respective laser microscope images of Examples, illustrated in the Figures, are images at the same magnification.

Example 2

Figure 2:
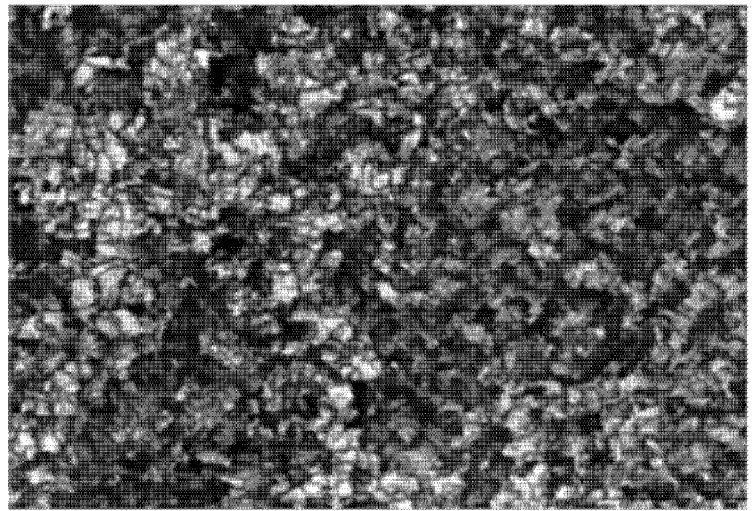
FIG. 2 is a laser microscope image illustrating the surface of a composite of Example 2.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A laser microscope image thereof is illustrated in FIG. 2. The Spc of the surface of the surface-treated alloy was measured according to "Measurement of surface roughness of alloy" described above, and was found to be 51620/mm. Furthermore, the tensile strength (bonding strength) between the surface-treated alloy and the PPS resin composition was measured according to "Tensile test" described above, and was found to be 20 MPa.

Example 3

Figure 3:
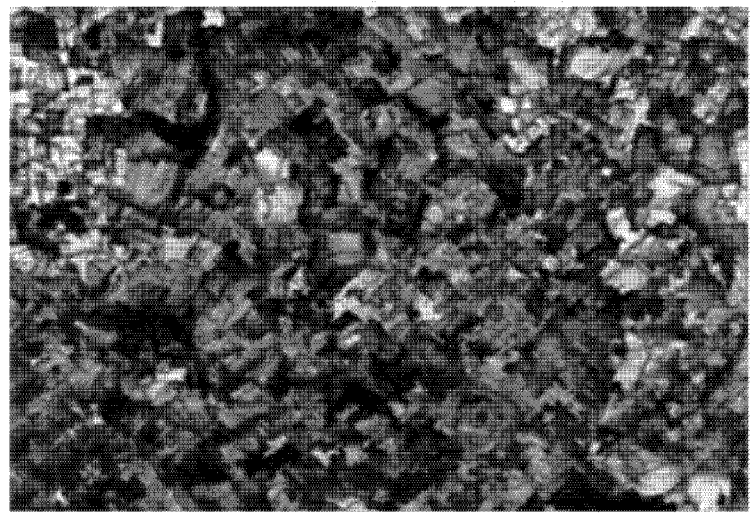
FIG. 3 is a laser microscope image illustrating the surface of a composite of Example 3.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A laser microscope image thereof is illustrated in FIG. 3. The Spc of the surface of the surface-treated alloy was measured according to "Measurement of surface roughness of alloy" described above, and was found to be 101311/mm. Furthermore, the tensile strength (bonding strength) between the surface-treated alloy and the PPS resin composition was measured according to "Tensile test" described above, and was found to be 22 MPa.

Example 4

Figure 4:
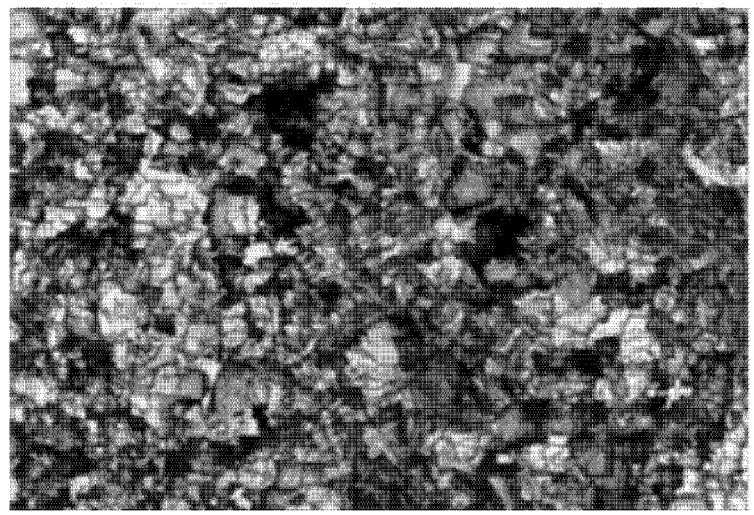
FIG. 4 is a laser microscope image illustrating the surface of a composite of Example 4.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A laser microscope image thereof is illustrated in FIG. 4. The Spc of the surface of the surface-treated alloy was measured according to "Measurement of surface roughness of alloy" described above, and was found to be 52301/mm. Furthermore, the tensile strength (bonding strength) between the surface-treated alloy and the PPS resin composition was measured according to "Tensile test" described above, and was found to be 25 MPa.

Example 5

Figure 5:
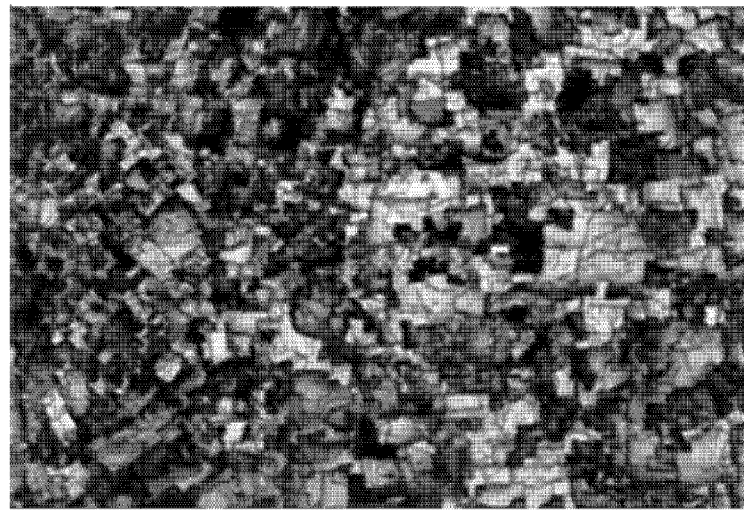
FIG. 5 is a laser microscope image illustrating the surface of a composite of Example 5.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A laser microscope image thereof is illustrated in FIG. 5. The Spc of the surface of the surface-treated alloy was measured according to "Measurement of surface roughness of alloy" described above, and was found to be 67109/mm. Furthermore, the tensile strength (bonding strength) between the surface-treated alloy and the PPS resin composition was measured according to "Tensile test" described above, and was found to be 28 MPa.

Example 6

Figure 6:
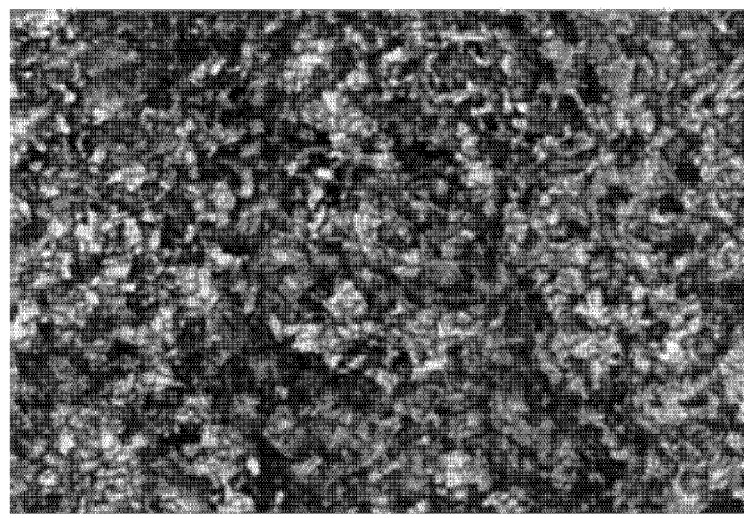
FIG. 6 is a laser microscope image illustrating the surface of a composite of Example 6.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A laser microscope image thereof is illustrated in FIG. 6. The Spc of the surface of the surface-treated alloy was measured according to "Measurement of surface roughness of alloy" described above, and was found to be 44500/mm. Furthermore, the tensile strength (bonding strength) between the surface-treated alloy and the PPS resin composition was measured according to "Tensile test" described above, and was found to be 18 MPa.

Example 7

Figure 7:
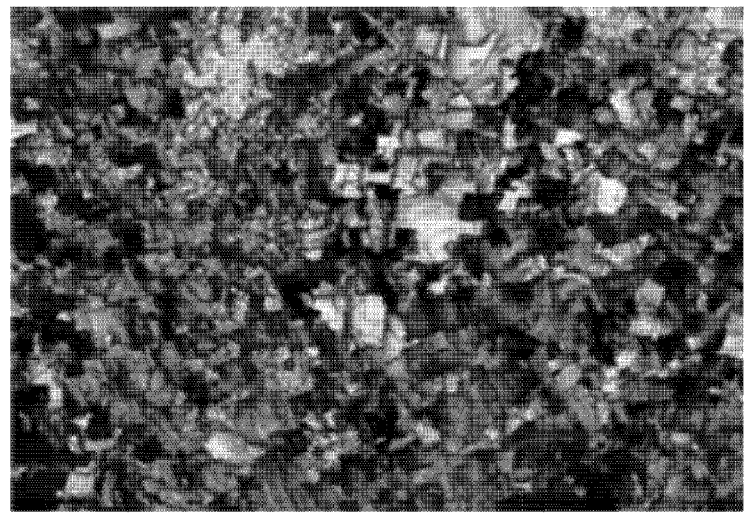
FIG. 7 is a laser microscope image illustrating the surface of a composite of Example 7.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A laser microscope image thereof is illustrated in FIG. 7. The Spc of the surface of the surface-treated alloy was measured according to "Measurement of surface roughness of alloy" described above, and was found to be 77304/mm. Furthermore, the tensile strength (bonding strength) between the surface-treated alloy and the PPS resin composition was measured according to "Tensile test" described above, and was found to be 15 MPa.

Example 8

Figure 8:
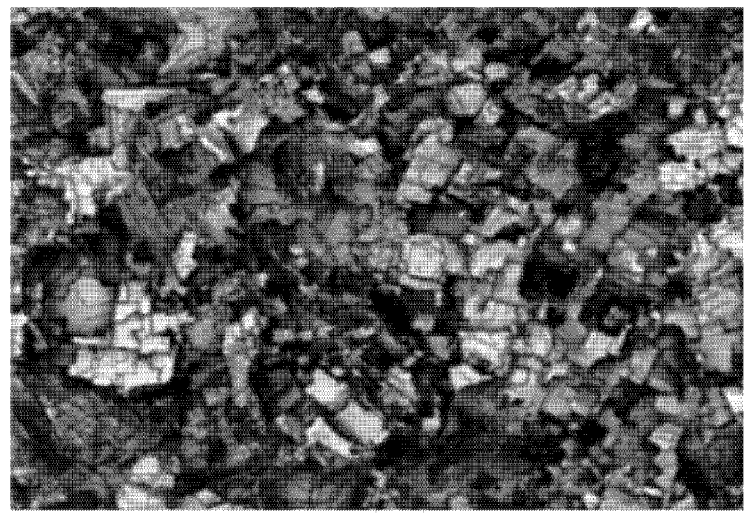
FIG. 8 is a laser microscope image illustrating the surface of a composite of Example 8.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A laser microscope image thereof is illustrated in FIG. 8. The Spc of the surface of the surface-treated alloy was measured according to "Measurement of surface roughness of alloy" described above, and was found to be 80922/mm. Furthermore, the tensile strength (bonding strength) between the surface-treated alloy and the PPS resin composition was measured according to "Tensile test" described above, and was found to be 28 MPa.

Example 9

Figure 9:
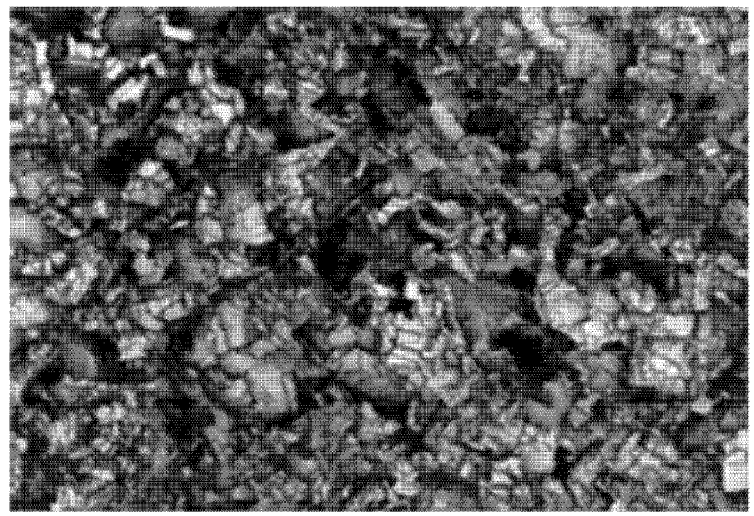
FIG. 9 is a laser microscope image illustrating the surface of a composite of Example 9.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A laser microscope image thereof is illustrated in FIG. 9. The Spc of the surface of the surface-treated alloy was measured according to "Measurement of surface roughness of alloy" described above, and was found to be 74777/mm. Furthermore, the tensile strength (bonding strength) between the surface-treated alloy and the PPS resin composition was measured according to "Tensile test" described above, and was found to be 23 MPa.

Example 10

Figure 10:
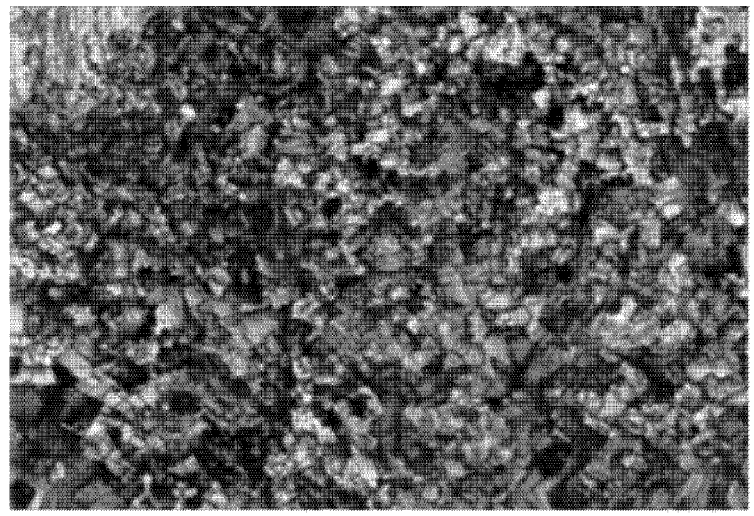
FIG. 10 is a laser microscope image illustrating the surface of a composite of Example 10.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A laser microscope image thereof is illustrated in FIG. 10. The Spc of the surface of the surface-treated alloy was measured according to "Measurement of surface roughness of alloy" described above, and was found to be 72764/mm. Furthermore, the tensile strength (bonding strength) between the surface-treated alloy and the PPS resin composition was measured according to "Tensile test" described above, and was found to be 26 MPa.

Comparative Example 1

Figure 11:
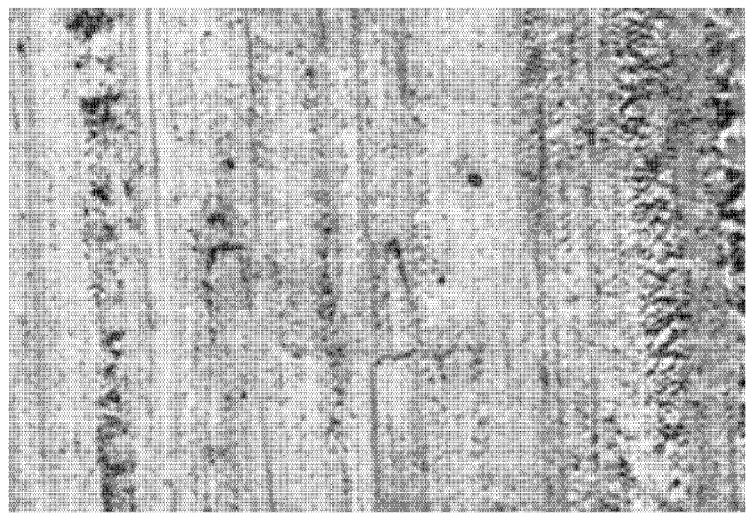
FIG. 11 is a laser microscope image illustrating the surface of a composite of Comparative Example 1.

An aluminum alloy piece (JIS A5052-H34) having a thickness of 1.0 mm and a size of 50 mm×20 mm was prepared. The aluminum alloy piece was first immersed in the aqueous solution for surface treatment at a liquid temperature of 40° C. for 1 minute. The aluminum alloy piece was immersed in ion exchange water, and thereafter dried in a hot air dryer set at 50° C. for 1 hour, and an alloy treated was thus obtained. The resulting surface-treated alloy was observed according to "Observation of surface of alloy" described above. A laser microscope image thereof is illustrated in FIG. 11. The Spc of the surface of the alloy treated was measured according to "Measurement of surface roughness of alloy" described above, and was found to be 3665/mm. Furthermore, a composite was tried to be produced in the same manner as in Example 1 except that the alloy treated was used, but the alloy and the PPS resin composition were not bonded and no composite was obtained.

Comparative Example 2

Figure 12:
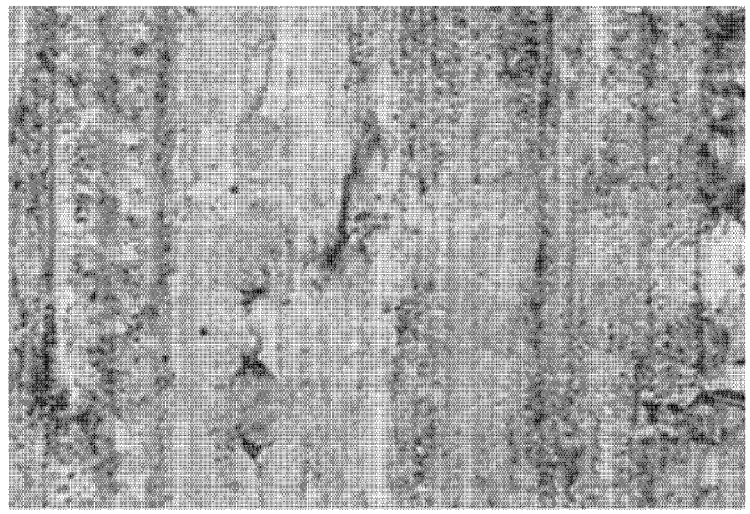
FIG. 12 is a laser microscope image illustrating the surface of a composite of Comparative Example 2.

An aluminum alloy piece (JIS A5052-H34) having a thickness of 1.0 mm and a size of 50 mm×20 mm was prepared. The aluminum alloy piece was first immersed in the aqueous solution for surface treatment at a liquid temperature of 40° C. for 1 minute. The aluminum alloy piece was immersed in ion exchange water, and thereafter dried in a hot air dryer set at 50° C. for 1 hour, and an alloy treated was thus obtained. The resulting surface-treated alloy was observed according to "Observation of surface of alloy" described above. A laser microscope image thereof is illustrated in FIG. 12. The Spc of the surface of the alloy treated was measured according to "Measurement of surface roughness of alloy" described above, and was found to be 2859/mm. Furthermore, a composite was tried to be produced in the same manner as in Example 1 except that the alloy treated was used, but the alloy and the PPS resin composition were not bonded and no composite was obtained.

Comparative Example 3

Figure 13:
FIG. 13 is a laser microscope image illustrating the surface of a composite of Comparative Example 3.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A laser microscope image thereof is illustrated in FIG. 13. The Spc of the surface of the surface-treated alloy was measured according to "Measurement of surface roughness of alloy" described above, and was found to be 63252/mm. Furthermore, a composite was tried to be produced in the same manner as in Example 1 except that the alloy treated was used, but the alloy and the PPS resin composition were not bonded and no composite was obtained.

Comparative Example 4

Figure 14:
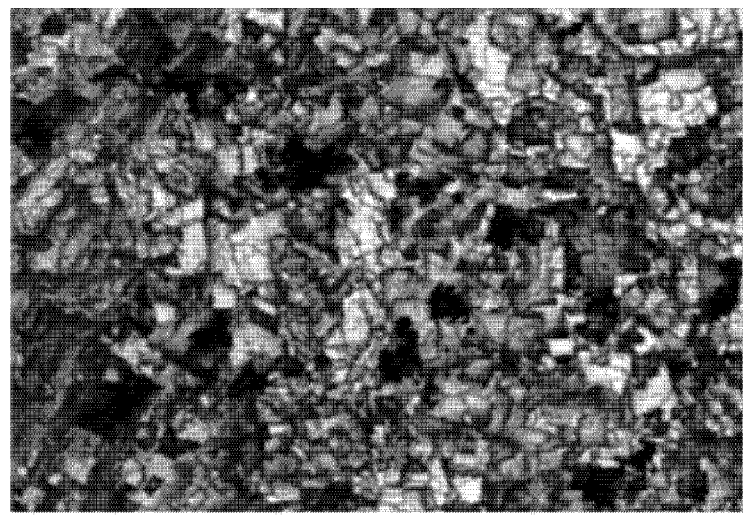
FIG. 14 is a laser microscope image illustrating the surface of a composite of Comparative Example 4.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A SEM image thereof is illustrated in FIG. 14. The Spc of the surface of the surface-treated alloy was measured according to "Measurement of surface roughness of alloy" described above, and was found to be 50306/mm. Furthermore, a composite was tried to be produced in the same manner as in Example 1 except that the alloy treated was used, but the alloy and the PPS resin composition were not bonded and no composite was obtained.

Comparative Example 5

Figure 15:
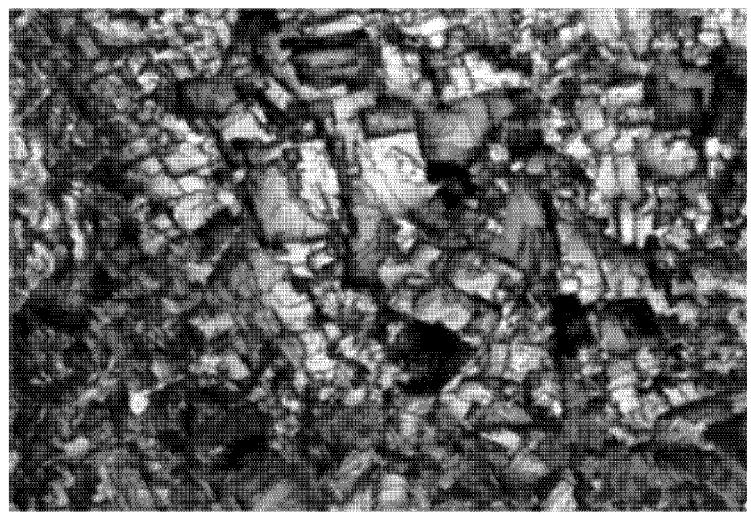
FIG. 15 is a laser microscope image illustrating the surface of a composite of Comparative Example 5.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A SEM image thereof is illustrated in FIG. 15. The Spc of the surface of the surface-treated alloy was measured according to "Measurement of surface roughness of alloy" described above, and was found to be 68587/mm. Furthermore, a composite was tried to be produced in the same manner as in Example 1 except that the alloy treated was used, but the alloy and the PPS resin composition were not bonded and no composite was obtained.

Comparative Example 6

Figure 16:
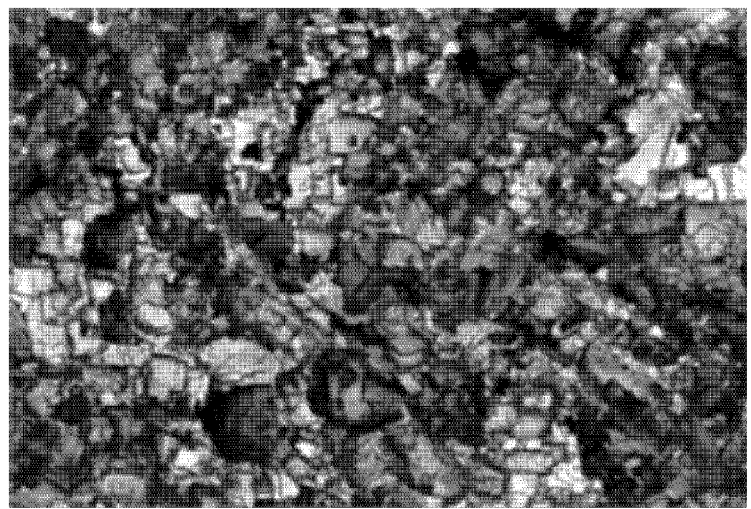
FIG. 16 is a laser microscope image illustrating the surface of a composite of Comparative Example 6.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A laser microscope image thereof is illustrated in FIG. 16. The Spc of the surface of the surface-treated alloy was measured according to "Measurement of surface roughness of alloy" described above, and was found to be 63409/mm. Furthermore, a composite was tried to be produced in the same manner as in Example 1 except that the alloy treated was used, but the alloy and the PPS resin composition were not bonded and no composite was obtained.

Comparative Example 7

Figure 17:
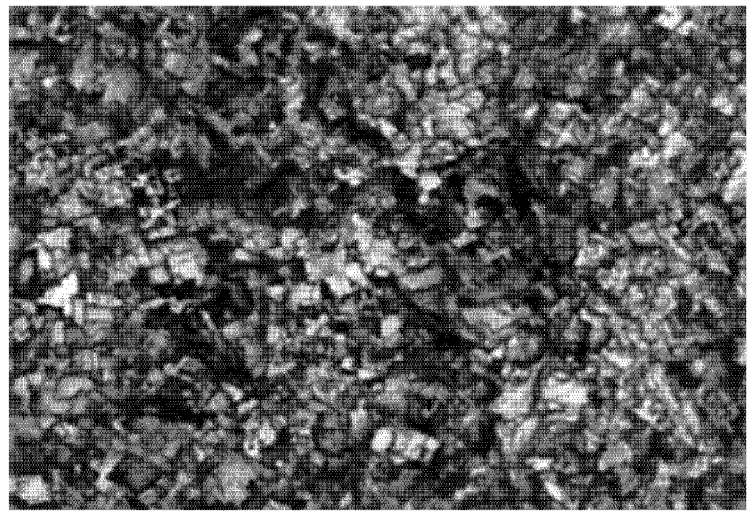
FIG. 17 is a laser microscope image illustrating the surface of a composite of Comparative Example 7.

An aluminum alloy piece (JIS A5052-H34) having a thickness of 1.5 mm and a size of 50 mm×20 mm was prepared. The aluminum alloy piece was first immersed in the aqueous solution for surface treatment at a liquid temperature of 40° C. for 1 minute, and an alloy piece where copper was deposited on the surface was obtained. Next, the alloy piece was sufficiently washed with ion exchange water, thereafter immersed in the aqueous oxidant-acid solution at a liquid temperature of 40° C. until the copper deposited could be removed, and further sufficiently washed with ion exchange water. Thereafter, the alloy piece after removal of the copper was dried in a hot air dryer set at 50° C. for 1 hour, and a surface-treated alloy was thus obtained. The resulting surface-treated alloy was observed according to "Observation of surface of alloy" described above. A laser microscope image thereof is illustrated in FIG. 17. The Spc of the surface of the surface-treated alloy was measured according to "Measurement of surface roughness of alloy" described above, and was found to be 52370/mm. Furthermore, a composite was tried to be produced in the same manner as in Example 1 except that the alloy treated was used, but the alloy and the PPS resin composition were not bonded and no composite was obtained.

TABLE 3

| | Aqueous solution for surface treatment | | | | | |
|---|---|---|---|---|---|---|
| | Copper compound | | Heterocyclic nitrogen compound | | Halide | |
| | Compound name | Copper ion concentration/ppm | Compound name | Compound concentration/ppm | Compound name | Halide ion concentration/ppm |
| Example 1 | Copper (II) sulfate pentahydrate | 25000 | Pyrazole | 300 | Sodium chloride | 2500 |
| Example 2 | Copper (II) bromide | 25000 | Pyrazole | 300 | Copper (II) bromide | 62400 |
| Example 3 | Copper (II) sulfate pentahydrate | 25000 | 5-Aminotetrazole | 300 | Sodium chloride | 2500 |
| Example 4 | Copper (II) sulfate pentahydrate | 25000 | Imidazole | 300 | Sodium chloride | 2500 |
| Example 5 | Copper (II) sulfate pentahydrate | 25000 | Pyrazole | 300 | Potassium chloride | 2500 |
| Example 6 | Copper (II) sulfate pentahydrate | 25000 | Pyrazole | 300 | Potassium bromide | 2500 |
| Example 7 | Copper (II) sulfate pentahydrate | 25000 | Pyrazole | 300 | Sodium chloride | 2500 |
| Example 8 | Copper (II) sulfate pentahydrate | 25000 | Pyrazole | 300 | Sodium chloride | 2500 |
| Example 9 | Copper (II) sulfate pentahydrate | 25000 | Pyrazole | 300 | Sodium chloride | 2500 |
| Example 10 | Copper (II) sulfate pentahydrate | 25000 | Pyrazole | 300 | Sodium chloride | 2500 |
| Comparative Example 1 | Copper (II) sulfate pentahydrate | 25000 | — | 0 | — | 0 |
| Comparative Example 2 | Copper (II) sulfate pentahydrate | 25000 | Pyrazole | 300 | — | 0 |
| Comparative Example 3 | Copper (II) sulfate pentahydrate | 15000 | Pyrazole | 300 | Sodium chloride | 2500 |
| Comparative Example 4 | Copper (II) sulfate pentahydrate | 25000 | Pyrazole | 50 | Sodium chloride | 2500 |
| Comparative Example 5 | Copper (II) sulfate pentahydrate | 25000 | Pyrazole | 100 | Sodium chloride | 2500 |
| Comparative Example 6 | Copper (II) sulfate pentahydrate | 25000 | Pyrazole | 5000 | Sodium chloride | 2500 |
| Comparative Example 7 | Copper (II) sulfate pentahydrate | 25000 | Pyrazole | 300 | Sodium chloride | 1000 |

| | Aqueous oxidant-acid solution | Alloy treated | Resin composition | Spc/ 1/mm | Bonding strength/ MPa |
|---|---|---|---|---|---|
| Example 1 | Hydrogen peroxide/sulfuric acid | Al (5052) | GF-PPS | 82418 | 31 |
| Example 2 | Hydrogen peroxide/sulfuric acid | Al (5052) | GF-PPS | 51620 | 20 |
| Example 3 | Hydrogen peroxide/sulfuric acid | Al (5052) | GF-PPS | 101311 | 22 |
| Example 4 | Hydrogen peroxide/sulfuric acid | Al (5052) | GF-PPS | 52301 | 25 |
| Example 5 | Hydrogen peroxide/sulfuric acid | Al (5052) | GF-PPS | 67109 | 28 |

TABLE 3-continued

| | | | | | |
|---|---|---|---|---|---|
| Example 6 | Hydrogen peroxide/sulfuric acid | Al (5052) | GF-PPS | 44500 | 18 |
| Example 7 | Hydrogen peroxide/sulfuric acid | Al (1100) | GF-PPS | 77304 | 15 |
| Example 8 | Hydrogen peroxide/sulfuric acid | Al (5052) | GF-PA | 80922 | 28 |
| Example 9 | Hydrogen peroxide/sulfuric acid | Al (5052) | GF-PBT | 74777 | 23 |
| Example 10 | Ammonium persulfate/nitric acid | Al (5052) | GF-PPS | 72764 | 26 |
| Comparative Example 1 | — | Al (5052) | GF-PPS | 3665 | Not bonded |
| Comparative Example 2 | — | Al (5052) | GF-PPS | 2859 | Not bonded |
| Comparative Example 3 | Hydrogen peroxide/sulfuric acid | Al (5052) | GF-PPS | 63252 | Not bonded |
| Comparative Example 4 | Hydrogen peroxide/sulfuric acid | Al (5052) | GF-PPS | 50306 | Not bonded |
| Comparative Example 5 | Hydrogen peroxide/sulfuric acid | Al (5052) | GF-PPS | 68587 | Not bonded |
| Comparative Example 6 | Hydrogen peroxide/sulfuric acid | Al (5052) | GF-PPS | 63409 | Not bonded |
| Comparative Example 7 | Hydrogen peroxide/sulfuric acid | Al (5052) | GF-PPS | 52370 | Not bonded |

INDUSTRIAL APPLICABILITY

The present invention can provide an aqueous solution for surface treatment of an alloy, which enables bonding strength between the alloy and a resin composition to be increased, a method for producing a surface-treated alloy by use of the aqueous solution for surface treatment, and a composite including the surface-treated alloy and a method for producing the composite. Accordingly, the present invention has industrial applicability in the fields of a surface-treated alloy and a composite, in which such properties are demanded.

The invention claimed is:

1. An aqueous solution suitable for treating a surface of an alloy, the aqueous solution comprising:
   a copper compound at a copper ion concentration of 20000 ppm or more and 45000 ppm or less;
   a heterocyclic nitrogen compound at a concentration of 200 ppm or more and 3000 ppm or less; and
   a halide at a halide ion concentration of 2000 ppm or more and 70000 ppm or less,
   wherein the heterocyclic nitrogen compound comprises pyrazole,
   wherein the copper compound comprises copper (II) sulfate and/or copper (II) bromide,
   wherein the halide comprises at least one selected from the group consisting of sodium chloride, potassium chloride, and potassium bromide, and
   wherein the aqueous solution is formulated such that copper is deposited on the surface of the alloy when the aqueous solution is contacted with the surface of the alloy.

2. The solution of claim 1, wherein the heterocyclic nitrogen compound further comprises an azole compound.

3. The solution of claim 2, wherein the azole compound comprises 5-aminotetrazole and/or imidazole.

4. The solution of claim 3, wherein the copper compound comprises copper (II) bromide.

5. The solution of claim 3, wherein the copper compound comprises copper (II) sulfate.

6. The solution of claim 1, wherein the copper compound comprises copper (II) sulfate.

7. The solution of claim 1, wherein the alloy is an aluminum alloy.

8. The solution of claim 1, wherein the heterocyclic nitrogen compound further comprises a 5-aminotetrazole.

9. The solution of claim 1, wherein the heterocyclic nitrogen compound further comprises an imidazole.

10. The solution of claim 1, wherein the heterocyclic nitrogen compound further comprises a 5-aminotetrazole and an imidazole.

11. The solution of claim 1, wherein the copper compound comprises copper (II) bromide.

12. The solution of claim 1, which does not comprise hydrogen peroxide or peracetic acid.

13. The solution of claim 1, wherein the halide comprises sodium chloride.

14. The solution of claim 1, wherein the halide comprises potassium chloride and/or potassium bromide.

15. The solution of claim 1, which comprises less than 0.5% by mass of acid.

16. A method for producing a surface-treated alloy, comprising:
   contacting the aqueous solution of claim 1 with a surface of an alloy; and
   dissolving or dispersing copper deposited on the surface of an alloy in the contacting, in an aqueous solution comprising an oxidant and an acid, to remove the copper, thereby obtaining a surface-treated alloy.

17. The method of claim 16, wherein the oxidant is peroxide.

18. The method of claim 16, wherein the acid is an inorganic acid.

19. A composite, comprising:
   a surface-treated alloy obtained by the method of claim 16; and
   a resin composition comprising a thermoplastic resin,
   wherein the resin composition is bonded to the surface-treated alloy.

20. A method for producing a composite, the method comprising:
   bonding a surface-treated alloy obtained by the method of claim 16 and a resin composition comprising a thermoplastic resin, thereby obtaining a composite.

21. The method of claim 20, further comprising:
   inserting the surface-treated alloy into a mold, before the obtaining of the composite,
   wherein the bonding comprises injecting into and molding in a mold, the resin composition comprising a thermoplastic resin, to thereby bond the surface-treated alloy and the resin composition.

* * * * *